(12) United States Patent
Motomiya et al.

(10) Patent No.: US 9,466,422 B2
(45) Date of Patent: Oct. 11, 2016

(54) METHOD OF MANUFACTURING A LAMINATED ELECTRONIC COMPONENT

(71) Applicant: TAIYO YUDEN CO., LTD., Taito-ku, Tokyo (JP)

(72) Inventors: Yoshiyuki Motomiya, Takasaki (JP); Shigeto Takei, Takasaki (JP); Toru Oowada, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 60 days.

(21) Appl. No.: 14/159,239

(22) Filed: Jan. 20, 2014

(65) Prior Publication Data

US 2014/0292468 A1 Oct. 2, 2014

(30) Foreign Application Priority Data

Mar. 28, 2013 (JP) .................................. 2013-070217

(51) Int. Cl.
| | |
|---|---|
| *H01F 41/04* | (2006.01) |
| *H01F 41/12* | (2006.01) |
| *H01F 41/02* | (2006.01) |
| *H05K 3/10* | (2006.01) |
| *H05K 3/12* | (2006.01) |
| *H01F 17/00* | (2006.01) |

(52) U.S. Cl.
CPC ........ *H01F 41/041* (2013.01); *H01F 17/0013* (2013.01); *H01F 41/02* (2013.01); *H01F 41/04* (2013.01); *H01F 41/042* (2013.01); *H01F 41/043* (2013.01); *H01F 41/122* (2013.01); *H01F 41/125* (2013.01); *H05K 3/108* (2013.01); *H05K 3/1291* (2013.01); *H01F 2017/0093* (2013.01); *Y10T 29/4902* (2015.01); *Y10T 29/49064* (2015.01); *Y10T 29/49155* (2015.01); *Y10T 156/1039* (2015.01)

(58) Field of Classification Search
CPC ...... H01F 41/02; H01F 41/04; H01F 41/041; H01F 41/042; H01F 41/043; H01F 41/122; H01F 41/126; H01F 17/0013; H01F 17/0093; H01F 41/125; Y10T 156/1039; Y10T 29/4902; Y10T 29/49064; Y10T 29/49155; H05K 3/108; H05K 3/1291
See application file for complete search history.

(56) References Cited

U.S. PATENT DOCUMENTS

| | | | | |
|---|---|---|---|---|
| 4,689,594 | A * | 8/1987 | Kawabata et al. ...... | H01F 41/02 |
| 6,808,641 | B2 * | 10/2004 | Tonami et al. ........ | H05K 3/108 |
| 2005/0190036 | A1* | 9/2005 | Uriu et al. ............ | H01F 41/041 |

FOREIGN PATENT DOCUMENTS

| | | | |
|---|---|---|---|
| JP | 2002-038292 A | | 2/2002 |
| JP | 2009267291 A | * | 11/2009 |

* cited by examiner

*Primary Examiner* — A. Dexter Tugbang
(74) *Attorney, Agent, or Firm* — Law Office of Katsuhiro Arai

(57) ABSTRACT

A laminated electronic component whose internal electrode has sufficient cross-section area to achieve lower resistance, while also achieving a narrower pitch to accommodate more windings, is manufactured by forming a resist film on a conductive base plate; forming an opening of specified pattern in the resist film by photolithography; filling a conductor in the opening, by plating, to a level lower than the height of the resist film to form a conductor pattern; removing the resist film; transferring the conductor pattern from the base plate onto an insulation sheet; and laminating pattern-transferred insulation sheets obtained as above and then heating to obtain insulator layers from the insulation sheet, while obtaining internal electrodes from the conductor patterns.

8 Claims, 3 Drawing Sheets

METHOD OF MANUFACTURING A LAMINATED ELECTRONIC COMPONENT

FIELD OF THE INVENTION

The present invention relates to a laminated electronic component having a laminate of ceramic layers, glass layers and other insulator layers and internal electrodes formed between these layers, as well as a manufacturing method for such laminated electronic component.

DESCRIPTION OF THE RELATED ART

Figure 4:
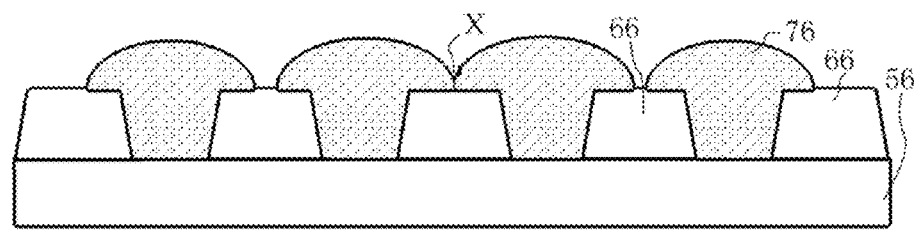

Laminated electronic components, representative of which are laminated common mode choke coils, etc., have traditionally had internal electrode patterns formed by means of electroplating at the pattern openings on a conductive substrate that has been patterned with photosensitive resist using photolithography technology (Patent Literature 1). FIG. 4 is a schematic section view of an internal electrode pattern before transfer. An plated-over part 76 (hereinafter referred to as "bump") projecting like a mushroom on top of an internal electrode pattern formed at an opening provided in a resist film 66 on a base plate 56 is pressed against a lamination sheet to transfer the pattern, and this lamination/transfer process is repeated to form an internal conductor.

Figure 5:
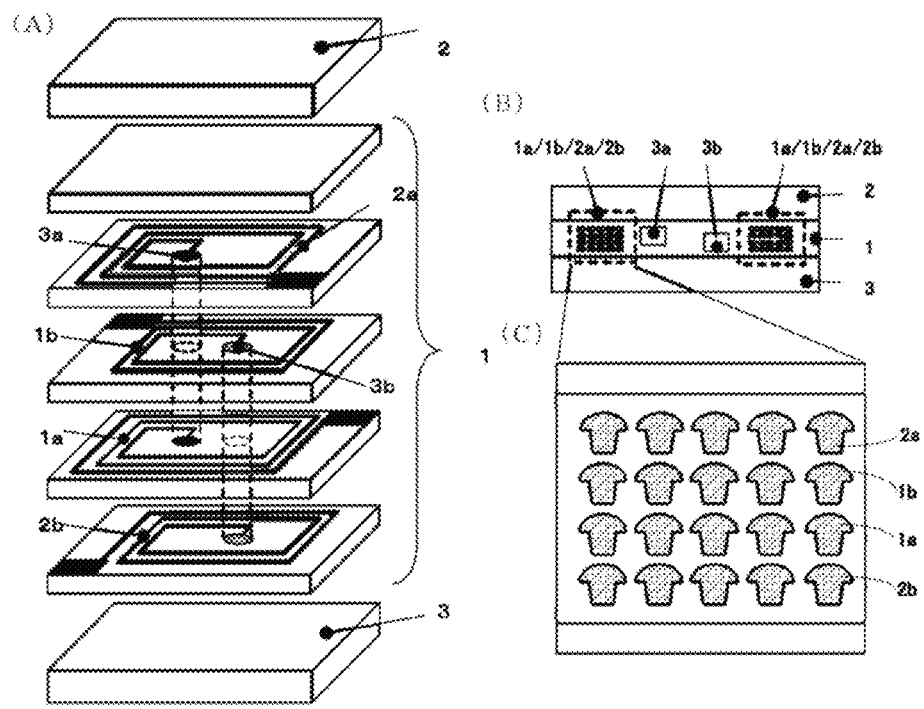

FIG. 5 is a schematic drawing of a laminated common mode choke coil provided as an example of such conventional laminated electronic component. Internal electrodes 1a, 1b, 2a, 2b of the respective layers are structured to be connected via conductor-printed through holes 3a, 3b provided on the respective sheets. The structure of the component as a whole is generally such that internal layers 1 (virtually nonmagnetic) in which the aforementioned internal electrodes are embedded are laminated with their top and bottom sandwiched by magnetic layers 2, 3. This component is a laminated component, meaning that the component is generally sintered as one at 750 to 950° C. at the final step.

Circuits in which laminated common mode choke coils and other laminated electronic components are used are becoming higher in frequency, while at the same time they are required to be smaller in size and higher in impedance. Accordingly, problems of attenuated input signals are being reported, which is caused by increased direct current resistance as a result of making the internal conductors thinner in order to reduce the size. The number of windings of internal electrode patterns must be increased to ensure high impedance, but areas that can be occupied by internal electrodes are decreasing as the component becomes smaller, and the internal electrode pitch (interval between internal electrodes) is also decreasing.

Under the prior art, when internal electrode plating is formed the plating is propagated above the height of the resist film to form bumps, as shown in FIG. 4. However, controlling the propagation of plating is difficult in areas above the resist film. Particularly when the pattern pitch decreases, shorting of internal electrodes may occur due to varying pitches, as indicated by X in the figure.

For this reason, the cross-section area of the internal electrode must be decreased as a way to make the internal electrode smaller and thinner under the prior art, and the resistance tends to increase as a result. Furthermore, bumps must be formed smaller in order to ensure a sufficient internal electrode pitch to prevent shorting, but this reduces the engagement with the lamination sheet and negatively affects the transfer property, potentially leading to a drop in productivity.

BACKGROUND ART LITERATURES

[Patent Literature 1] Japanese Patent Laid-open No. 2002-038292

SUMMARY

In light of the above, an object of the present invention is to provide a laminated electronic component whose internal electrode has enough cross-section area to achieve lower resistance, while also achieving a narrower pitch to accommodate more windings, in order to support smaller size and higher impedance, as well as to provide a manufacturing method for such laminated electronic component.

After studying in earnest, the inventors found a new method of forming internal electrodes and completed the present invention, the characteristics of which are described below.

The present invention relates to a manufacturing method for a laminated electronic component having a laminate constituted by multiple insulator layers as well as internal electrodes formed between these layers. The manufacturing method proposed by the present invention comprises: a step to form a resist film on a conductive base plate; a step to form an opening of specified pattern in the resist film by means of photolithography; a step to form a conductor pattern by filling a conductor in the opening, by means of plating, to a level lower than the height of the resist film that defines the opening; a step to remove the resist film; a step to press the conductor pattern together with an insulation sheet being a precursor to the insulator layer, in order to transfer the conductor pattern onto the insulation sheet; and a step to laminate pattern-transferred insulation sheets prepared as above, to obtain insulator layers from the insulation sheets, while obtaining internal electrodes from the conductor patterns.

It is favorable that the opening of specified pattern is formed in such a way that the width of the opening increases continuously or in stages in the direction away from the base plate, or preferably the opening assumes a roughly trapezoidal shape whose cross section taken along a line perpendicular to the length direction widens in the direction away from the base plate.

The shape of the internal electrode is not limited in any way and the internal electrode may constitute a coil, for example. The insulator layer may be constituted by heating the laminate obtained in the aforementioned lamination step and then sintering the resulting insulation sheet.

Furthermore, the laminated electronic component manufactured by the aforementioned manufacturing method is also included in the scope of the present invention.

Any discussion of problems and solutions involved in the related art has been included in this disclosure solely for the purposes of providing a context for the present invention, and should not be taken as an admission that any or all of the discussion were known at the time the invention was made.

According to the present invention, because the resist film is removed prior to transfer, although there is no bump part (which is defined as a protuberance on a top surface of a resist or as a shape corresponding to the protuberance, typically having a cross section similar to a cross section of a pileus of a mushroom), the plating part as a whole functions as a bump, and because there is no friction between the plating part and the wall surface of the resist film, stable transfer property and productivity are ensured. Unlike under the conventional method, plating is formed to a level lower than the height of the resist film when a conductor pattern is formed, which means that a "wall" of the resist film is always present between patterns and this markedly reduces the concerns over shorting of internal electrodes. In addition, the bump-free manufacturing method proposed by the present invention produces more conductor per a conductor pattern of desired line width compared to the prior art under which the width of the internal electrode plating pattern is determined by the width of the bump, and consequently the direct current resistance is expected to decrease.

In a favorable embodiment, forming an internal conductor pattern by allowing its width to increase in the direction away from the base plate, prior to transfer, allows the wider parts of the internal electrode pattern to be pressed against the insulation sheet after transfer, which in turn increases the stability of the plated conductor and reduces the concerns over transfer errors manifesting as a result of the plated conductor tilting or sticking to the base plate. In addition, the contact area increases at the time of transfer, which reduces the force required for transfer and makes the base plate less prone to deformation, thereby promoting reuse of the base plate.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

DESCRIPTION OF THE SYMBOLS

1: Nonmagnetic layer
1a, 1b, 2a, 2b: Internal electrode
3a, 3b: Through hole
2, 3: Magnetic layer
51, 56: Base plate
61, 66: Resist film
71, 72, 73, 76: Conductor pattern

DETAILED DESCRIPTION OF EMBODIMENTS

These and other features of this invention will now be described with reference to the drawings of preferred embodiments which are intended to illustrate and not to limit the invention. The drawings are greatly simplified for illustrative purposes and are not necessarily to scale.

Figure 1:
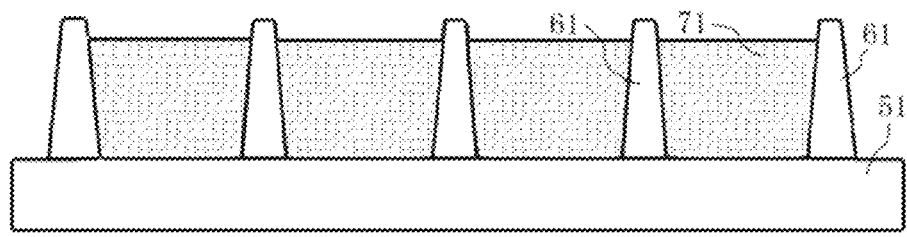

FIG. 1 is a schematic section view of a base plate in one stage of the manufacturing method proposed by the present invention.

Figure 2:
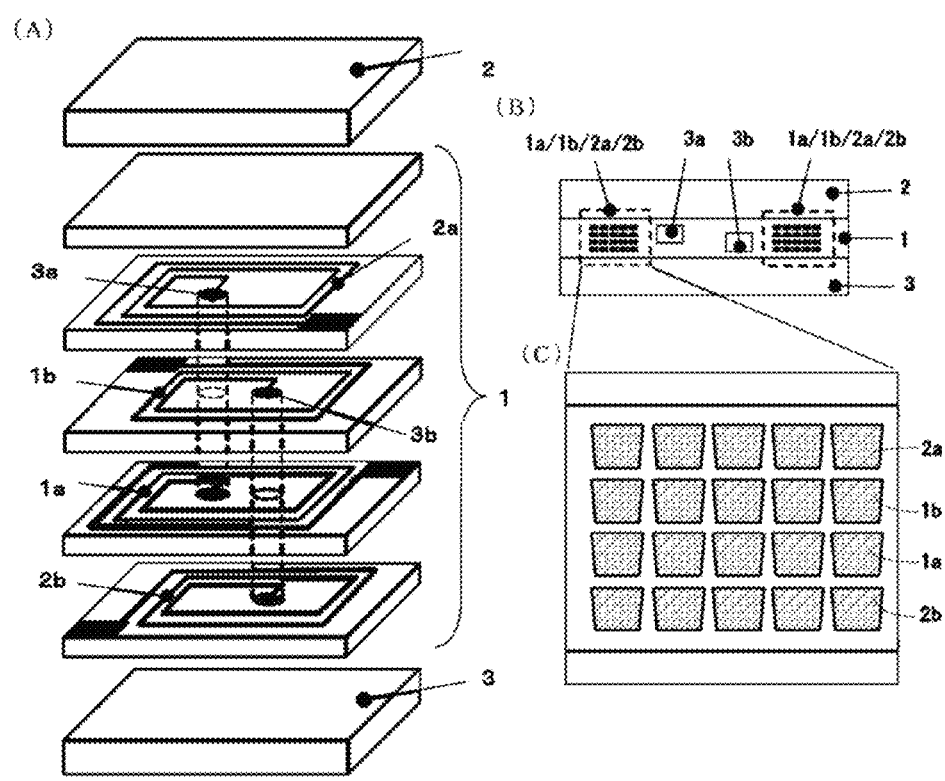

FIG. 2 consists of (A), (B), and (C) which are a schematic exploded view, section view, and enlarged partial view, respectively, showing an example of laminated electronic component obtained according to the present invention.

Figure 3:
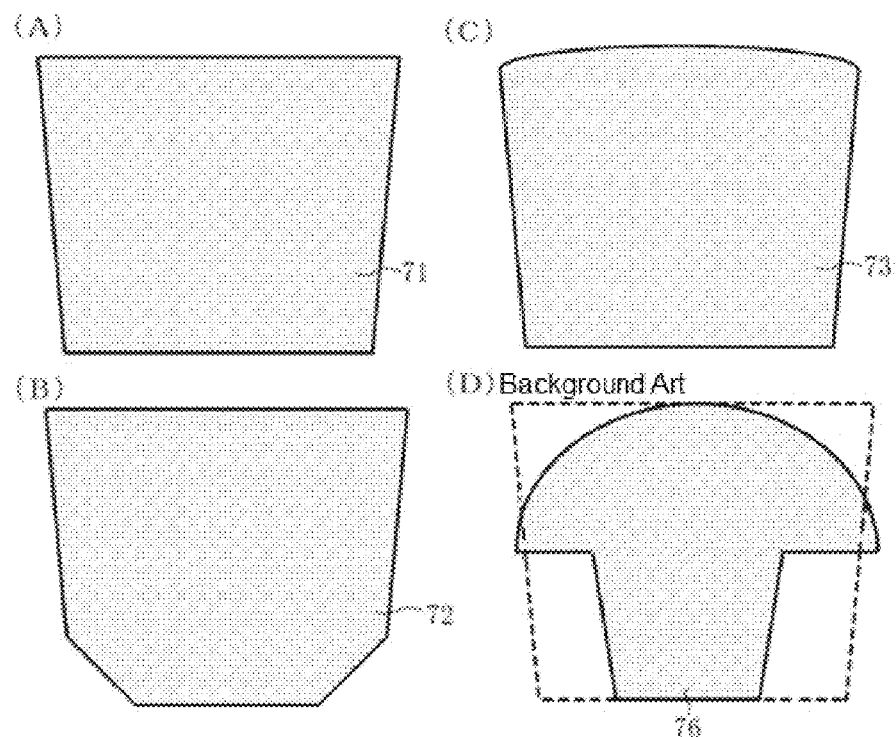

FIG. 3 consists of (A), (B), and (C) which are schematic section views of internal electrode patterns according to embodiments of the present invention, and (D) which is a schematic section view of a conventional internal electrode pattern in comparison with an embodiment of the present invention depicted with a broken line.

FIG. 4 is a schematic section view of a conventional internal electrode pattern before transfer.

FIG. 5 consists of (A), (B), and (C) which are a schematic exploded view, section view, and enlarged partial view, respectively, showing an example of conventional laminated electronic component.

DETAILED DESCRIPTION OF EMBODIMENTS

The present invention is described in detail by referring to the drawings as deemed appropriate. Note, however, that the present invention is not limited in any way to the illustrated embodiments and that, because characteristic parts of the invention may be emphasized in the drawings, the scale of each part of the drawings may not be accurate.

According to the present invention, a resist film is formed on a conductive base plate. For the conductive base plate, any suitable background art can be referenced as deemed appropriate, and a SUS (stainless steel) plate, nickel plate or copper plate may be used, for example. For the material and forming method for resist, any suitable background art can be referenced as deemed appropriate, but normally novolac resin, polyimide resin, epoxy resin or other photosensitive resist is applied after an alkali or acid-based degreasing and washing, to form a resist film.

Next an opening of specified pattern is formed in this resist film. The opening is formed by means of photolithography and for the specific procedure, any prior art can be referenced as deemed appropriate. The term "specified pattern" means that the pattern is designed to become an internal conductor after transfer. If the laminated electronic component is a coil component, for example, this pattern may be a coiled pattern for forming a coil. The opening may be formed by means of pre-baking that involves tentative drying of the resist film, exposure that involves irradiating UV, etc., using photo-mask, or development that exposes the pattern, for example. Under the present invention, photolithography can be implemented as the negative type or positive type.

Preferably the opening formed in the resist film widens continuously or in stages in the direction away from the base plate, or more preferably the opening is formed roughly in a trapezoidal shape that widens in the direction away from the base plate. The "width of the opening" represents the "width" on a section view of the opening pattern taken along a line perpendicular to its length direction. The phrase "roughly in a trapezoidal shape" means that the opening shape is roughly laterally symmetrical in the aforementioned section view and widens more or less continuously in the direction away from the base plate. As the opening widens in the direction away from the base plate, the wider parts contact the insulation sheet side when the conductor pattern is transferred onto the insulation sheet from the base plate, which makes the conductor pattern less prone to tilting after transfer and the stability increases as a result.

Thereafter, plating is applied to the opening formed in the resist film. As a result of this process, a conductor is filled in the opening and a conductor pattern is formed. At this time, plating is applied in such a way that the conductor pattern becomes lower than the height of the resist film. The height of the resist film indicates the height of the resist film at a location corresponding to the "wall" that forms the opening. FIG. 1 is a schematic section view of a base plate in one stage of the manufacturing method proposed by the present invention. An opening is provided in a resist film 61 that has been formed on a base plate 51, and a conductor 71 is filled into the opening by means of plating and a conductor pattern is formed as a result. FIG. 1 is a section view of the conductor pattern taken along a line perpendicular to its length direction. The conductor 71 is filled to a level lower than the height of the resist film 61. The opening formed in the resist film 61 assumes a roughly trapezoidal shape that widens in the direction away from the base plate 51.

For the process of plating itself, any prior art can be referenced as deemed appropriate. Examples include, but are not limited to, using silver or copper as the plating metal and performing pre-treatment by means of acid electrolysis to remove contaminants, after which the acid is removed with pure water and strike plating is performed to form a plating base, which is followed by final plating while adjusting the plating current, and further by post-treatment such as removal of plating solution and washing.

Once the conductor pattern has been formed by means of plating, the resist film 61 is removed. The resist film 61 can be removed using an organic solvent or other solvent appropriate for the resist being used, and as a result only the conductor pattern 71 remains on the base plate 51.

Next, the conductor pattern 71 on the base plate 51 is transferred onto an insulation sheet. The insulation sheet is a member (precursor) that will become an insulator layer in the laminated electronic component as a result of sintering or heat treatment. For the process of transfer itself, any prior art can be referenced as deemed appropriate, but generally it can be done by pressing the insulation sheet against the conductor pattern 71 on the base plate 51 and then separating the sheet, together with the conductor pattern, from the base plate.

For the insulation sheet, its material, constitution, etc., can be set in any way as deemed appropriate according to the type of the final laminated electronic component to be manufactured. When manufacturing a common mode choke coil, for example, a sheet made of magnetic material or nonmagnetic insulation material can be used for the insulation sheet.

Such pattern-transferred insulation sheets are laminated as deemed appropriate and cut, and then heated or sintered, to obtain insulator layers from the insulation sheets, while obtaining internal electrodes from the conductor patterns. The insulator layers may be sintered layers, and the heating/sintering conditions, etc., can be adjusted as deemed appropriate for the purpose.

FIG. 2 is a schematic drawing showing a laminated common mode choke coil as an example of a laminated electronic component obtained according to the present invention. Internal electrodes 1a, 1b, 2a, 2b of the respective layers are structured to be connected via conductor-printed through holes 3a, 3b provided on the respective sheets. The structure of the component as a whole is generally such that internal layers 1 (virtually nonmagnetic) in which the aforementioned internal electrodes are embedded are laminated with their top and bottom sandwiched by magnetic layers 2, 3. Here, sections of the internal electrodes 1a, 1b, 2a, 2b taken along lines perpendicular to their length direction assume a roughly trapezoidal shape.

FIG. 3 provides section views of conductor patterns taken along lines perpendicular to their length direction. (A) in FIG. 3 depicts an electrode pattern 71 of roughly trapezoidal shape that widens continuously at a specified ratio in the direction away from the base plate. (B) in FIG. 3 depicts an electrode pattern 72 that widens in two stages at different ratios in the direction away from the base plate, and any technology to obtain such electrode pattern 72 is also included in the scope of the present invention. (C) in FIG. 3 depicts an electrode pattern 73 that widens continuously at a specified ratio in the direction away from the base plate, where this electrode pattern 73 is characterized by bulging at the center of the plated surface. Any manufacturing method to obtain such pattern whose plated surface is not flat is also included in the scope of the present invention. (D) in FIG. 3 depicts an electrode pattern 76 formed according to the prior art. The dotted line depicts an estimated shape of electrode pattern that can be obtained when the technology of the present invention is applied based on the same width as the electrode pattern 76 of mushroom cross-section shape based on the prior art. If an electrode is to be formed at the same pattern width, the cross-section area of the formed conductor becomes larger when the technology of the present invention is applied, as is evident from comparing the solid line and dotted line in (D) in FIG. 3, and consequently the direct current resistance is expected to decrease.

EXAMPLE

The present invention is explained more specifically below using an example. Note, however, that the present invention is not at all limited to the embodiment described in this example.

An example of manufacturing a common mode choke coil, which is a representative form of laminated electronic component, is given. In this example, a choke coil with a product size of 0.45×0.3×0.25 mm, whose overview is shown in FIG. 2, was manufactured. This common mode choke coil had magnetic layers 2, 3 constituted by Ni—Zn ferrite at its top and bottom, with nonmagnetic layers 1 constituted by Zn ferrite provided in between. Internal electrodes 1a, 1b, 2a, 2b were formed on the four nonmagnetic layers 1, and the internal electrodes 1a and 2a were electrically connected via a through hole 3a, while the internal electrode patterns 1b and 2b were electrically connected via a through hole 3b, to constitute two electrically independent coils.

For the manufacture of these internal electrode patterns, a SUS sheet of 150 μm in thickness was used as the base plate, and a resist film made of polyimide resin was formed with a spin coater by adjusting the spin coater speed during the application so that the thickness of the completed resist film would become approx. 10 μm. Next, the base plate was tentatively dried (pre-baked) at 110 to 130° C. for approx. 3 minutes, followed by UV irradiation of the resist film using photo-mask (positive type). Next, specified development solution was used to form an opening corresponding to each internal electrode pattern. The width of the opening on the base plate side was 7 μm and the opening pattern was continuously widened in the direction away from the base plate to reach 10 μm at the surface of the resist film, where the section of the opening had a trapezoidal shape. The interval between adjacent opening patterns was 3 μm at the narrowest part where the patterns were closest to each other. Ashing and acid electrolysis were performed to treat and wash away the residues in the opening, and then silver was electroplated to form a base plating layer of 1 μm or less in thickness. Thereafter, final plating was performed in the form of silver electroplating, filling silver in the opening and thereby forming a plating layer of 8 μm in thickness. This was followed by removal of plating solution and washing with pure water, to complete a substrate on which a specified patterned (plating) conductor was formed. Finally all resist film was removed with acetone so that only the patterned conductor (patterns) remained on the base plate.

Separately from the above, an insulation sheet was formed from a slurry containing Zn ferrite and this insulation sheet was pressure-bonded with the aforementioned base plate having conductor patterns formed on it, to transfer the conductor patterns from the base plate onto the insulation sheet. At this time, the transfer pressure could be lowered as the insulation sheet contacted the conductor over a larger area. No transfer failures occurred with such lower pressure. Thereafter, through holes were provided at specified positions and insulation sheets prepared as above were laminated and then sandwiched at top and bottom by two magnetic layers constituted by Ni—Zn ferrite, to obtain an unsintered chip. This unsintered chip was sintered at approx. 800 to 900° C. to obtain a common mode choke coil.

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, an article "a" or "an" may refer to a species or a genus including multiple species, and "the invention" or "the present invention" may refer to at least one of the embodiments or aspects explicitly, necessarily, or inherently disclosed herein. In this disclosure, any defined meanings do not necessarily exclude ordinary and customary meanings in some embodiments.

The present application claims priority to Japanese Patent Application No. 2013-070217, filed Mar. 28, 2013, the disclosure of which is incorporated herein by reference in its entirety.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A manufacturing method for a laminated electronic component having a laminate constituted by multiple insulator layers as well as internal electrodes formed between these layers, said manufacturing method comprising:
    step (i) to form a resist film on a conductive base plate;
    step (ii) to form an opening of specified pattern in the resist film by photolithography, wherein the opening of specified pattern is formed such that a width of the opening increases continuously or in stages in a direction away from the base plate;
    step (iii) to form a conductor pattern by filling a conductor in the opening, by plating, to a level lower than a height of the resist film that defines the opening;
    step (iv) to remove the resist film;
    step (v) to press the conductor pattern together with an insulation sheet being a precursor to the insulator layer, in order to transfer the conductor pattern from the conductive base plate onto the insulation sheet;
    step (vi) to repeat steps (i) to (v) to produce multiple pattern-transferred insulation sheets; and
    step (vii) to laminate the pattern-transferred insulation sheets.

2. A manufacturing method according to claim 1, wherein the opening of specified pattern is formed such that the opening assumes roughly a trapezoidal shape whose cross section taken along a line perpendicular to a length direction widens in a direction away from the base plate.

3. A manufacturing method according to claim 2, wherein the internal electrodes constitute a coil.

4. A manufacturing method according to claim 3, wherein the insulator layers are constituted by sintered compacts obtained from sintering the multiple pattern-transferred insulation sheets.

5. A manufacturing method according to claim 2, wherein the insulator layers are constituted by sintered compacts obtained from sintering the multiple pattern-transferred insulation sheets.

6. A manufacturing method according to claim 1, wherein the internal electrodes constitute a coil.

7. A manufacturing method according to claim 6, wherein the insulator layers are constituted by sintered compacts obtained from sintering the multiple pattern-transferred insulation sheets.

8. A manufacturing method according to claim 1, wherein the insulator layers are constituted by sintered compacts obtained from sintering the multiple pattern-transferred insulation sheets.

* * * * *